United States Patent
Ryu et al.

(10) Patent No.: US 11,121,077 B2
(45) Date of Patent: Sep. 14, 2021

(54) SEMICONDUCTOR DEVICE AND METHOD OF MANUFACTURING A SEMICONDUCTOR DEVICE

(71) Applicant: Amkor Technology Singapore Holding Pte. Ltd., Singapore (SG)

(72) Inventors: Ji Yeon Ryu, Incheon (KR); Jae Beom Shim, Incheon (KR)

(73) Assignee: Amkor Technology Singapore Holding PTE. LTD., Singapore (SG)

(*) Notice: Subject to any disclaimer, the term of this patent is extended or adjusted under 35 U.S.C. 154(b) by 70 days.

(21) Appl. No.: 16/507,365

(22) Filed: Jul. 10, 2019

(65) Prior Publication Data
US 2021/0013144 A1 Jan. 14, 2021

(51) Int. Cl.
*H01L 23/522* (2006.01)
*H01L 23/00* (2006.01)
*H01L 23/31* (2006.01)

(52) U.S. Cl.
CPC ...... *H01L 23/5226* (2013.01); *H01L 23/3128* (2013.01); *H01L 24/06* (2013.01); *H01L 24/14* (2013.01); *H01L 24/17* (2013.01); *H01L 2224/02311* (2013.01); *H01L 2224/02331* (2013.01); *H01L 2224/0603* (2013.01); *H01L 2224/06102* (2013.01)

(58) Field of Classification Search
CPC . H01L 23/5226; H01L 23/3128; H01L 24/06; H01L 24/17; H01L 24/14; H01L 2224/06102; H01L 2224/0603; H01L 2224/02311; H01L 2224/02331
See application file for complete search history.

(56) References Cited

U.S. PATENT DOCUMENTS

| | | | |
|---|---|---|---|
| 8,877,554 B2* | 11/2014 | Tsai | H01L 23/5389 438/106 |
| 10,074,553 B2* | 9/2018 | Lin | H01L 25/50 |
| 2006/0038291 A1* | 2/2006 | Chung | H01L 24/12 257/738 |
| 2008/0318413 A1* | 12/2008 | Fillion | H01L 24/97 438/637 |

* cited by examiner

*Primary Examiner* — Marcos D. Pizarro
*Assistant Examiner* — Sue Tang
(74) *Attorney, Agent, or Firm* — Spectrum IP Law Group LLC

(57) ABSTRACT

In one example, a semiconductor device comprises a substrate comprising a dielectric, a first conductor on a top side of the dielectric, and a second conductor on a bottom side of the dielectric, wherein the dielectric has an aperture, and the first conductor comprises a partial via contacting a pad of the second conductor through the aperture, an electronic device having an interconnect electrically coupled to the first conductor, and an encapsulant on a top side of the substrate contacting a side of the electronic device. Other examples and related methods are also disclosed herein.

22 Claims, 9 Drawing Sheets

SEMICONDUCTOR DEVICE AND METHOD OF MANUFACTURING A SEMICONDUCTOR DEVICE

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
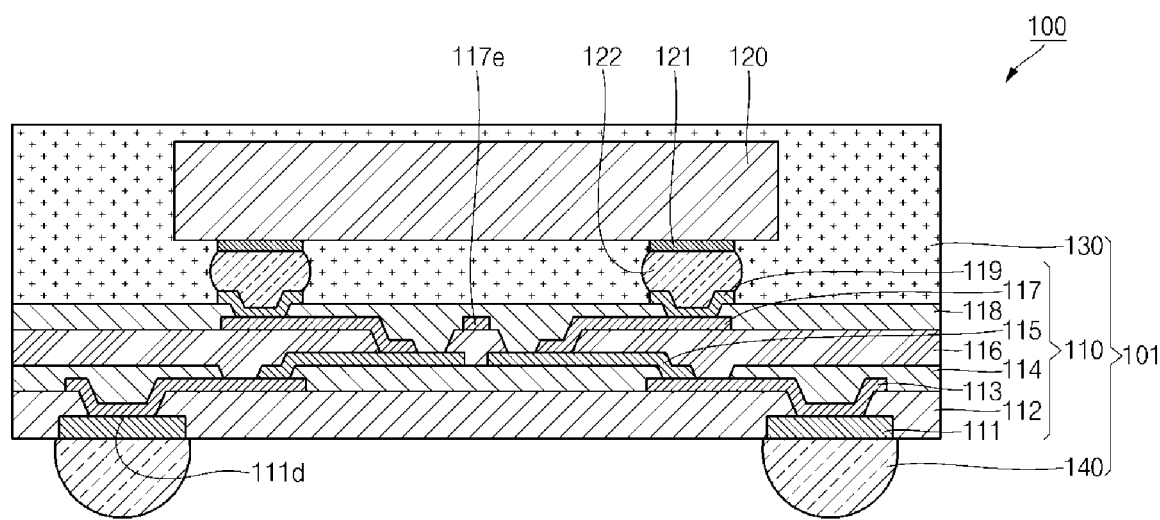
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a substrate comprising a dielectric, a first conductor on a top side of the dielectric, and a second conductor on a bottom side of the dielectric, wherein the dielectric has an aperture, and the first conductor comprises a partial via contacting a pad of the second conductor through the aperture, an electronic device having an interconnect electrically coupled to the first conductor, and an encapsulant on a top side of the substrate contacting a side of the electronic device.

In another example, a method to manufacture a semiconductor device comprises providing a first conductor on a top side of a dielectric, providing a second conductor on a bottom side of the dielectric, providing an aperture in the dielectric, wherein the first conductor comprises a partial via contacting a pad of the second conductor through the aperture, providing an electronic device having an interconnect contacting the first conductor, and providing an encapsulant on a top side of the dielectric and contacting a side of the electronic device.

In yet another example, a semiconductor structure comprises a redistribution layer (RDL) substrate, comprising a first dielectric layer having a first aperture, a first conductive layer on the first dielectric layer, wherein the first conductive layer has a full via in the first aperture, a second dielectric layer having a second aperture, wherein the second dielectric layer is on a top surface of the first dielectric layer, and a second conductive layer on a top surface of the second dielectric layer, wherein the second conductive layer has a partial via in the second aperture contacting the first conductive layer through the second aperture. The semiconductor structure also comprises an electronic device on a top side of the RDL substrate, wherein the electronic device comprises an interconnect electrically coupled with the second conductive layer, and an encapsulant on the top side of the RDL substrate contacting a side of the electronic device.

Other examples are included in the present disclosure. Such examples may be found in the figures, in the claims, or in the description of the present disclosure.

FIG. 1 shows a cross-sectional view of an example semiconductor device 100. In the example shown in FIG. 1, semiconductor device 100 can include a substrate 110, an electronic device 120, an encapsulant 130 and interconnects 140.

Substrate 110 can include conductive layers 111, 113, 115, 117 and 119 and dielectric layers 112, 114, 116 and 118. Electronic device 120 can include a terminal 121 and an interconnect 122 electrically connected to terminal 121. Terminal 121 can be formed on a bottom surface of electronic device 120. Interconnect 122 can be made of a conductive material and can be electrically connected to conductive layer 119 of substrate 110.

Encapsulant 130 can cover a top surface of substrate 110 and a top surface or a side of electronic device 120. In addition, interconnects 140 can be made of a conductive material and can be formed on a bottom surface of substrate 110. Substrate 110, encapsulant 130, and interconnects 140 can be referred to as a semiconductor package 101 or a package 101. Semiconductor package 101 can protect electronic device 120 from being exposed to external factors or circumstances. In addition, semiconductor package 101 can provide an electrical connection between an external component, such as a printed circuit board, and electronic device 120.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

Figure 2A:
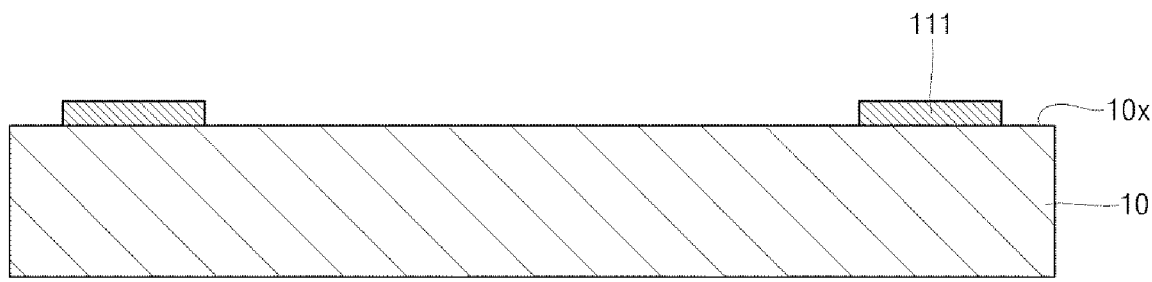
FIGS. 2A to 2M show cross-sectional views of an example method for manufacturing an example semiconductor device.

FIG. 2A to FIG. 2N show cross-sectional views of an example method for manufacturing an example semiconductor device 100. FIG. 3A to FIG. 3D show partially enlarged plan views for the cross-sectional views of the semiconductor device 100 shown in FIG. 2B to FIG. 2E.

FIG. 2A shows the semiconductor device 100 at an initial stage of manufacture. In the example shown in FIG. 2A, carrier 10 can be in the shape of a substantially planar plate. In some examples, carrier 10 can comprise or be referred to as a board, a wafer, a panel, or a strip. In addition, in some examples, carrier 10 can be made of at least one or more of a metal (e.g., SUS), a wafer (e.g., silicon), ceramic (e.g., alumina), glass (e.g., soda-lime glass), or any equivalent thereof. Carrier 10 can have a thickness in the range from approximately 50 μm (microns, micrometers) to approximately 1000 μm and a width in the range from approximately 100 mm to approximately 300 mm. Carrier 10 can function to handle multiple components in an integrated manner, providing structural integrity while substrate 110 is formed, while electronic device 120 is attached, and while encapsulant 130 is applied.

Conductive layer 111 can be formed on carrier 10. Conductive layer 111 can be formed to have a pattern on a top surface 10x of carrier 10 using a patterned mask. Conductive layer 111 can be shaped, for example, as a circle, a rectangle, or a polygon. In some examples, conductive layer 111 can comprise or be referred to as a conductive post, an under-bump metallization (UBM), a lower pad, or an external pad. In some examples, external pad 111 can be made of any of a variety of electrically conductive materials (e.g., copper, gold, silver, or an equivalent). In addition, in some examples, external pad 111 can be formed using any of a variety of processes including, but not limited to, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), or an equivalent. After external pad 111 is formed, the mask can be removed. External pad 111 can have a thickness in the range from approximately 0.1 μm to approximately 20 μm. External pad 111 can be an external input/output terminal of substrate 110, to allow interconnects 140 to be formed or attached under substrate 110.

Figure 2B:
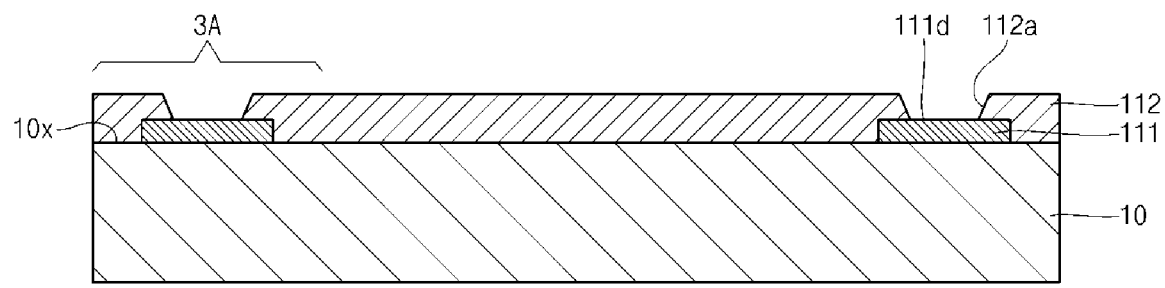
Figure 3A:
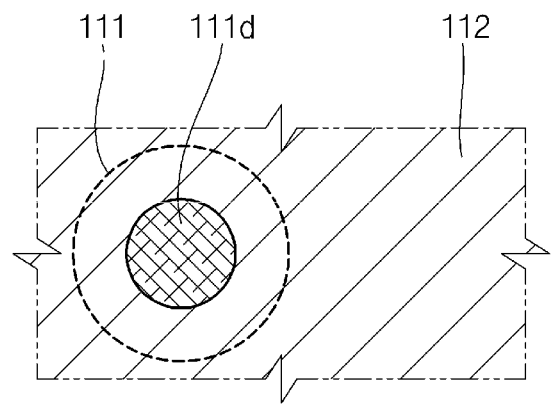
FIGS. 3A to 3F show partially enlarged plan views in the cross-sectional views of the semiconductor device shown in FIGS. 2B to 2G.

FIG. 2B and FIG. 3A show semiconductor device 100 at a later stage of manufacture. In the example shown in FIG. 2B and FIG. 3A, dielectric layer 112 can be formed to entirely cover the top surface 10x of carrier 10 and external pad 111. An aperture 112a exposing a base 111d of external pad 111 can be formed by patterning dielectric layer 112.

Dielectric layer 112 can comprise or be referred to as, for example, a passivation layer, an insulating layer, or a protection layer. In some examples, dielectric layer 112 can include an electrically insulating material, including, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layer 112 can be formed using any of a variety of processes (e.g., spin coating, spray coating, printing, PVD, CVD, MOCVD, ALD, LPCVD, or PECVD). Dielectric layer 112 can have a thickness in the range from approximately 3 μm to approximately 30 μm.

After a mask pattern is formed on a top surface of dielectric layer 112, aperture 112a can be formed by removing a portion of the dielectric layer 112 exposed by etching. Aperture 112a can comprise or be referred to as an opening or a hole. Dielectric layer 112 can expose base 111d that is a portion of a top surface of external pad 111 through aperture 112a. Dielectric layer 112 can cover a portion of the top outer perimeter of external pad 111, and the top surface 10x of carrier 10. Base 111d exposed by aperture 112a can be shaped, for example, as a circle, a rectangle, or a polygon. The shape of base 111d exposed by aperture 112a can be the same shape as external pad 111. The area of base 111d exposed by aperture 112a can be smaller than that of the of the area of external pad 111. In addition, base 111d exposed by aperture 112a can have a diameter in the range from approximately 10 µm to approximately 500 µm.

Figure 2C:
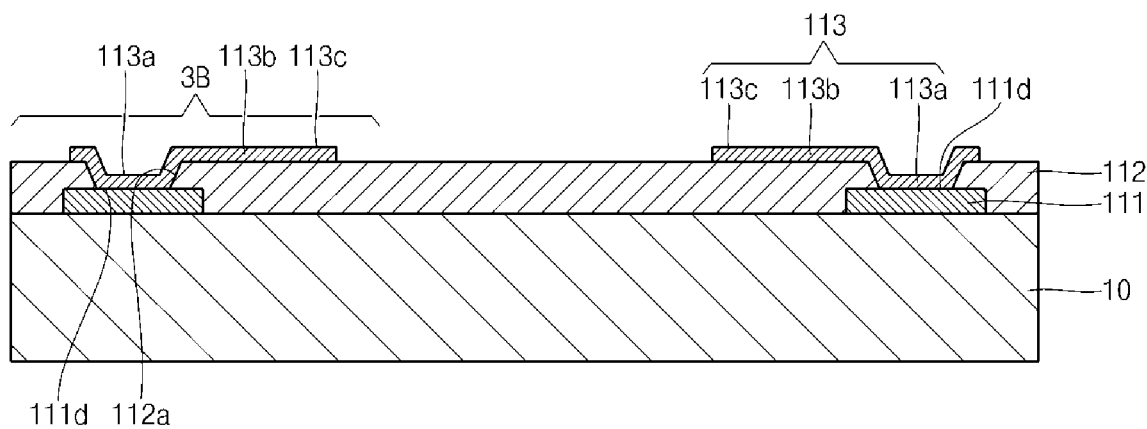
Figure 3B:
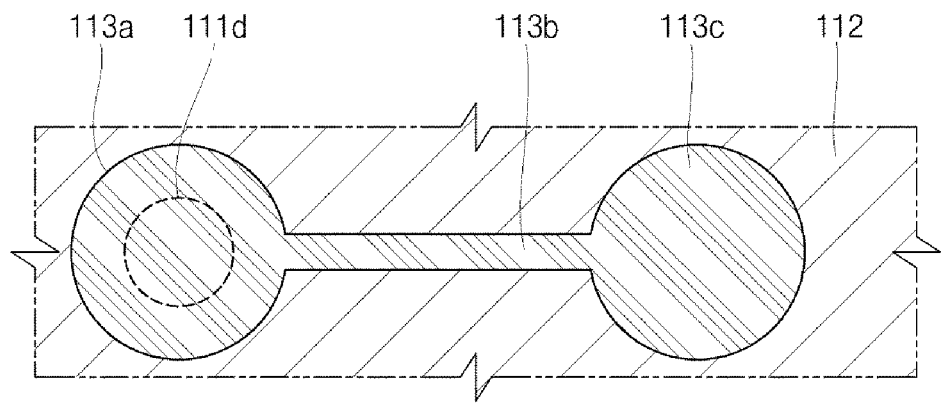

FIG. 2C and FIG. 3B show semiconductor device 100 at a later stage of manufacture. In the example shown in FIG. 2C and FIG. 3B, conductive layer 113 can be formed to cover the base 111d of external pad 111 and a portion of the exposed surface of dielectric layer 112.

Conductive layer 113 can be formed to have a plurality of patterns, which can be electrically connected to base 111d of external pad 111 exposed through aperture 112a, respectively. In addition, conductive layer 113 electrically connected to base 111d of external pad 111 can be extended to a top surface of dielectric layer 112.

Conductive layer 113 can comprise or be referred to as a redistribution layer (RDL), a wiring pattern, a trace pattern, or a circuit pattern. In some examples, redistribution layer 113 can be made of any of a variety of electrically conductive materials (e.g., copper, gold, silver or an equivalent). Redistribution layer 113 can be formed using any of a variety of processes including, but not limited to, sputtering, electroless plating, electroplating, PVD, CVD, MODVD, ALD, LPCVD, PECVD, or an equivalent. After redistribution layer 113 is formed to a predetermined thickness to cover the base 111d of external pad 111 and the exposed surface of dielectric layer 112, redistribution layer 113 can be patterned using a mask to create a plurality of wiring patterns or traces. Redistribution layer 113 can include a full via 113a entirely covering base 111d of external pad 111 and a trace 113b extending from the full via 113a to the top surface of dielectric layer 112. In addition, redistribution layer 113 can further include a pad 113c formed at an end of trace 113b. Pad 113c can be positioned on the top surface of dielectric layer 112. Trace 113b can electrically connect full via 113a and pad 113c. Full via 113a and pad 113c can be shaped, for example, as a circle, a rectangle, or a polygon. Full via 113a and pad 113c can have a size in the range from approximately 15 µm to approximately 550 µm. Redistribution layer 113 can have a thickness in the range from approximately 3 µm to approximately 20 µm.

Figure 2D:
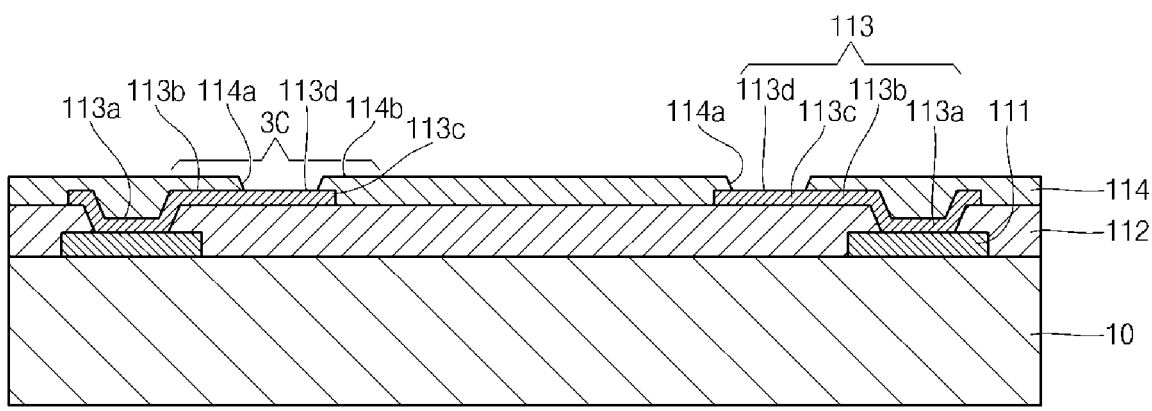
Figure 3C:
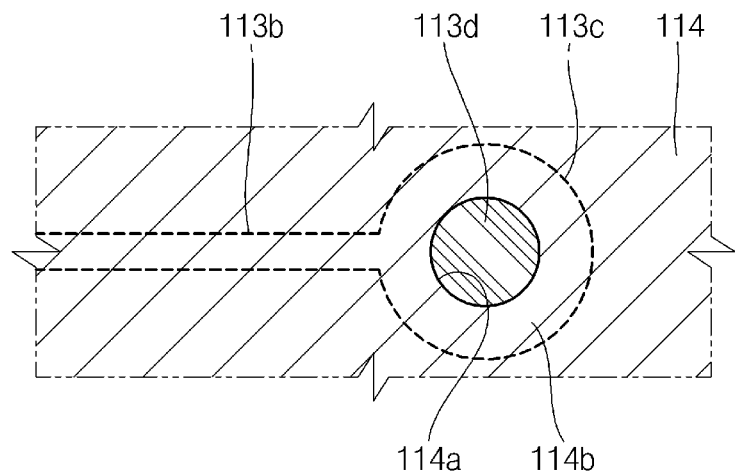

FIG. 2D and FIG. 3C show semiconductor device 100 at a later stage of manufacture. In the example shown in FIG. 2D and FIG. 3C, dielectric layer 114 can be formed to entirely cover redistribution layer 113 and dielectric layer 112, and an aperture 114a exposing a base 113d of redistribution layer 113 can be formed by patterning dielectric layer 114. Aperture 114a can expose a base 113d that is a portion of a top surface of pad 113c to the outside. Base 113d can be positioned roughly at the center of pad 113c. Dielectric layer 114 can cover a portion of a top surface of pad 113c.

Dielectric layer 114 can comprise or be referred to as, for example, a passivation layer, an insulating layer or a protection layer. In some examples, dielectric layer 114 can include an electrically insulating material, including, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layer 114 can be formed using any of a variety of processes (e.g., spin coating, spray coating, printing, PVD, CVD, MOCVD, ALD, LPCVD, or PECVD). Dielectric layer 114 can have a thickness in the range from approximately 3 µm to approximately 30 µm.

After a mask pattern is formed on a top surface of dielectric layer 114, aperture 114a can be formed by removing the dielectric layer 114 exposed by etching. Aperture 114a can comprise or be referred to as an opening or a hole. Dielectric layer 114 can expose base 113d that is a portion of a top surface of pad 113c through aperture 114a. The base 113d exposed by aperture 114a can be shaped, for example, as a circle, a rectangle, or a polygon. The area of base 113d exposed by aperture 114a can be smaller than that of the area of pad 113c of redistribution layer 113. In addition, the diameter of base 113d exposed by aperture 114a can have a size in the range from approximately 10 µm to approximately 500 µm. Dielectric layer 114 can further include peripheral portion 114b covering a top surface of pad 113c. Peripheral portions 114b can be positioned at outer areas around aperture 114a and can have a width in the range from approximately 5 µm to approximately 50 µm.

Figure 2E:
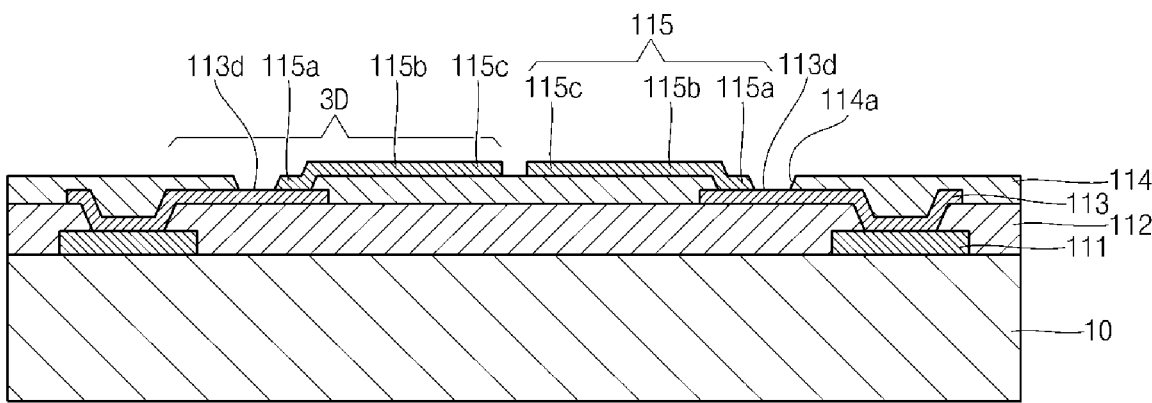
Figure 3D:
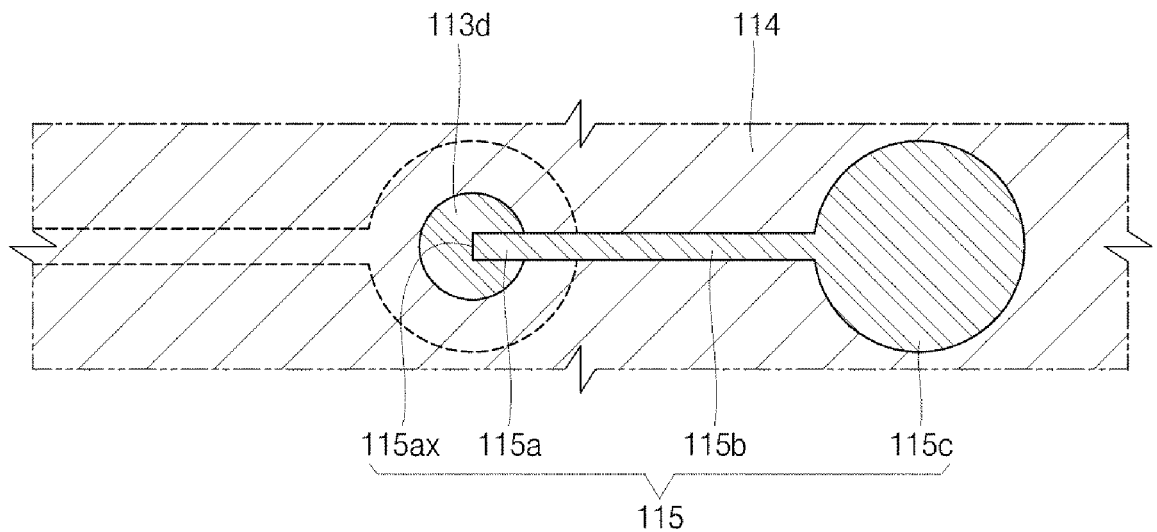

FIG. 2E and FIG. 3D show semiconductor device 100 at a later stage of manufacture. In the example shown in FIG. 2E and FIG. 3D, conductive layer 115 can be formed to cover the base 113d of redistribution layer 113 and a portion of the exposed surface of dielectric layer 114.

Substrate 110 can comprise a redistribution layer (RDL) substrate. Conductive layer 115 can be formed to have a plurality of patterns, which can be electrically connected to base 113d of redistribution layer 113 exposed through aperture 114a, respectively. In addition, conductive layer 113 electrically connected to redistribution layer 113 can be extended to a top surface of dielectric layer 114. Conductive layer 115 can be electrically connected to external pad 111 through redistribution layer 113. In some examples, a first conductor 115 can be provided on the top side of dielectric 114, and a second conductor 113 can be provided on the bottom side of dielectric 114. An aperture 114a can be provided in dielectric 114. The first conductor 115 can comprise a partial via 115a contacting pad base 113d of the second conductor 113 through the aperture 114a.

Conductive layer 115 can comprise or be referred to as a redistribution layer (RDL), a wiring pattern, a trace pattern, or a circuit pattern. In some examples, redistribution layer 115 can be made of any of a variety of electrically conductive materials (e.g., copper, gold, silver, or an equivalent). Redistribution layer 115 can be formed using any of a variety of processes including, but not limited to, sputtering, electroless plating, electroplating, PVD, CVD, MODVD, ALD, LPCVD, PECVD, or an equivalent. After redistribution layer 115 is formed to a predetermined thickness to cover the base 113d of redistribution layer 113 and the exposed surface of dielectric layer 114, redistribution layer 115 can be patterned using a mask pattern to have a plurality of patterns. Redistribution layer 115 can include a partial via 115a covering a portion of base 113d of redistribution layer 113, and a trace 115b extending from the partial via 115a to the top surface of dielectric layer 114. In addition, redistribution layer 115 can further include a pad 115c formed at an end of trace 115b.

Partial via 115a contacts, but does not fully cover, base 113d of redistribution layer 113. In addition, partial via 115a contacts, but does not fully cover, the sidewall of aperture 114a. In the present example, partial via 115a can be shaped as a line having constant width. An end 115ax of partial via 115a can be positioned roughly at the center of base 113d of redistribution layer 113. In base 113d of redistribution layer 113, a portion not covered by partial via 115a can remain exposed to the outside. Redistribution layer 115 can be electrically connected to redistribution layer 113 through partial via 115a. Although partial via 115a is shown here with a linear shape, other shapes are possible such as, for example, a semicircular shape or other geometric or non-geometric shape that only partially covers base 113d of redistribution layer 113. For instance, partial via 115a can cover up to half or less of the area or diameter of base 113d, or of the area of the sidewall of aperture 114a.

In some examples, as shown in FIG. 2B, substrate 110 comprises a redistribution layer (RDL) substrate comprising a first dielectric layer 112 having a first aperture 112a, and a first conductive layer 113 on the first dielectric layer 112, wherein the first conductive layer 113 has a full via 113a in the first aperture 112a. As shown in FIG. 2E, the RDL substrate 110 can comprise a second dielectric layer 114 having a second aperture 114a, wherein the second dielectric layer 114 is on the top surface of the first dielectric layer 112, and a second conductive layer 115 on the top surface of the second dielectric layer 114, wherein the second conductive layer 115 has a partial via 115a in the second aperture 114a electrically contacting the first conductive layer 113 through the second aperture 114a.

Trace 115b can be shaped as a line having a constant or nearly constant width. In addition, trace 115b can have the same width as partial via 115a. Trace 115b can have widths in the range from approximately 1 µm to approximately 100 µm. Trace 115b can electrically connect partial via 115a to pad 115c. Trace 115b can be positioned on top surface of dielectric layer 114. Peripheral portion 114b of dielectric layer 114 can be partially covered by trace 115d extending from partial via 115a electrically connected to base 113d. In addition, portions of peripheral portion 114b of dielectric layer 114, except for portions covered by trace 115b, can remain exposed.

Pad 115c can be shaped, for example, as a circle, a rectangle, or a polygon. Pad 115c can be positioned on the top surface of dielectric layer 114. Pad 115c can have a size in the range from approximately 15 µm to approximately 550 µm. Redistribution layer 115 can have a thickness in the range from approximately 3 µm to approximately 20 µm. In addition, redistribution layer 115 can reduce a distance between conductive patterns of redistribution layer 115 by forming partial via 115a partially covering base 113d and peripheral portion 114b, compared to a case of forming a full via that entirely covers base 113d, thereby achieving miniaturization or reduction in pitch between the pads or between the ends of the pads as shown in and described in further detail with respect to FIG. 2G and FIG. 2F, below.

Figure 2F:
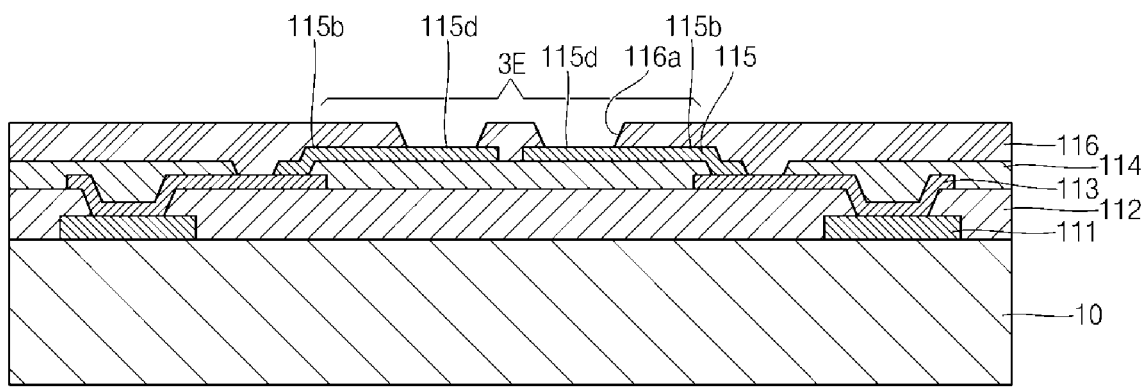
Figure 3E:
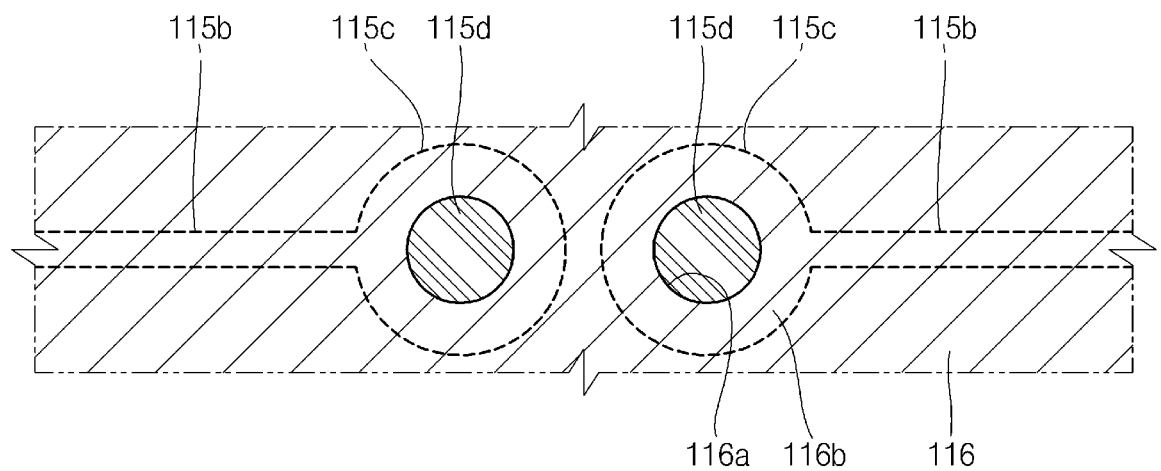

FIG. 2F and FIG. 3E show semiconductor device 100 at a later stage of manufacture. In the example shown in FIG. 2F and FIG. 3E, dielectric layer 116 can be formed to entirely cover base 113d, redistribution layer 115 and dielectric layer 114. An aperture 116a exposing a base 115d of redistribution layer 115 can be formed by patterning dielectric layer 116. Aperture 116a can expose base 115d that is a portion of a top surface of pad 115c of redistribution layer 115 to the outside. Base 115d can be positioned roughly at the center of pad 115c.

Dielectric layer 116 can comprise or be referred to as, for example, a passivation layer, an insulating layer, or a protection layer. In some examples, dielectric layer 116 can include an electrically insulating material, including, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layer 116 can be formed using any of a variety of processes (e.g., spin coating, spray coating, printing, PVD, CVD, MOCVD, ALD, LPCVD, or PECVD). Dielectric layer 116 can have a thickness in the range from approximately 3 µm to approximately 30 µm.

After a mask pattern is formed on a top surface of dielectric layer 116, aperture 116a can be formed by removing a portion of the dielectric layer 116 exposed by etching. Aperture 116a can comprise or be referred to as an opening or a hole. Dielectric layer 116 can expose base 115d that is a portion of a top surface of pad 115c of redistribution layer 115 to the outside. Base 115d exposed by aperture 116a can be shaped, for example, as a circle, a rectangle, or a polygon. The area of base 115d exposed by aperture 116a can be smaller than the area of pad 115c. In addition, base 115d exposed by aperture 116a can have a diameter in the range from approximately 10 µm to approximately 500 µm. Dielectric layer 116 can further include peripheral portion 116b covering a top surface of pad 115c. Peripheral portion 116b can be positioned at outer areas around aperture 116a and can have a width in the range from approximately 5 µm to approximately 50 µm.

Figure 2G:
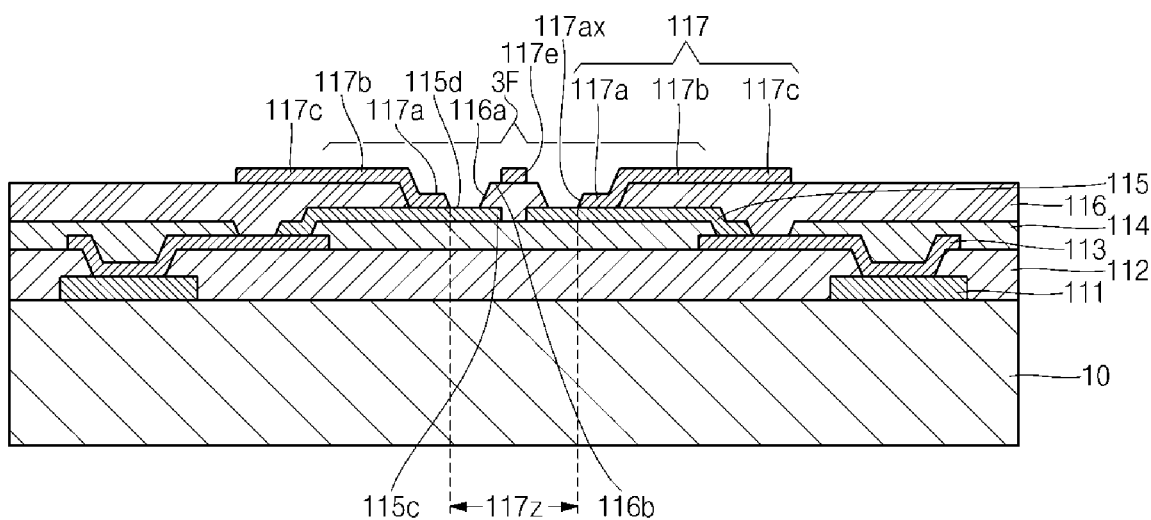
Figure 3F:
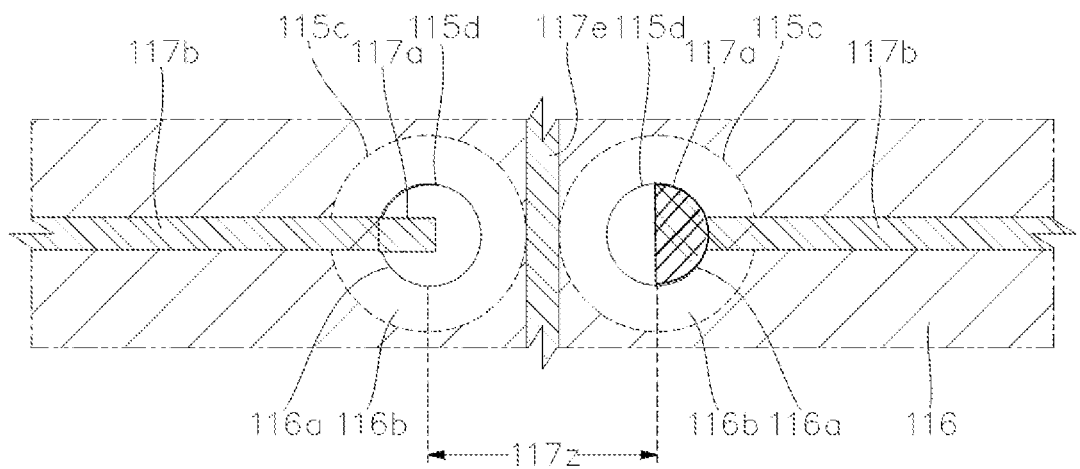

FIG. 2G and FIG. 3F show semiconductor device 100 at a later stage of manufacture. In the example shown in FIG. 2G and FIG. 3F, conductive layer 117 can be formed to cover the base 115d of redistribution layer 115 and a portion of the exposed surface of dielectric layer 116. In some examples, substrate 110 comprises dielectric 116, a first conductor 117 on a top side of dielectric 116, and a second conductor 115 on a bottom side of dielectric 116. Dielectric 116 can have an aperture 116a, and the first conductor 117 comprises a partial via 117a contacting pad base 115d of the second conductor 115 through aperture 116a. In some examples, the first conductor 117 comprises a first trace 117e on the top side of dielectric 116 and continuous with partial via 117a. In some examples, the first trace 117e and partial via 117a have the same width. In some examples, an end 117ax of partial via 117a contacts pad base 115d of the second conductor 115, and a trace 117e adjacent the end 117ax of partial via 117a overlaps a portion of pad base 115d of the second conductor 115 not covered by partial via 117a. In some examples, there can be a gap between adjacent pads 115c of the second conductor 115, and trace 117e overlaps a portion of the gap between the pad 115c of the second conductor 115 and an adjacent pad 115c of the second conductor 115.

Conductive layer 117 can be formed to have a plurality of patterns, which can be electrically connected to base 115d of redistribution layer 115 exposed through aperture 116a, respectively. In addition, conductive layer 117 electrically connected to redistribution layer 115 can be extended to a top surface of dielectric layer 116. Conductive layer 117 can be electrically connected to external pad 111 through redistribution layer 115 as well as redistribution layer 113.

Conductive layer 117 can comprise or be referred to as a redistribution layer (RDL), a wiring pattern or a circuit pattern. In some examples, redistribution layer 117 can be made of any of a variety of electrically conductive materials (e.g., copper, gold, silver, or an equivalent). Redistribution layer 117 can be formed using any of a variety of processes including, but not limited to, sputtering, electroless plating, electroplating, PVD, CVD, MODVD, ALD, LPCVD, PECVD or an equivalent. After redistribution layer 117 is formed to a predetermined thickness so as to cover the base 115d of redistribution layer 115 and the exposed surface of dielectric layer 116, it can be patterned using a mask pattern to have a plurality of wiring or circuit patterns. Redistribution layer 117 can include a partial via 117a covering a portion of pad base 115d of redistribution layer 115, and a trace 117b extending from partial via 117a to the top surface of dielectric layer 116. In addition, redistribution layer 117 can further include a pad 117c formed at an end of trace 117b.

Partial via 117a can be similar to, and can be similarly formed as, partial via 115a. Partial via 117a is formed such as to only partially cover pad base 115d of redistribution layer 115. Also, partial via 117a is formed such as to only partially cover the sidewall of aperture 116a of dielectric layer 116. In some examples, partial via 115a or partial via 117a can comprise a linear shape, or another shape such as a semicircular shape illustrated by the example of partial via 117a of FIG. 3F. In some examples, partial via 115a or partial via 117a can cover half or less than pad base 115d.

Trace 117b can be similar to, and can be similarly formed as, trace 115b. Trace 117b is formed on dielectric layer 116, and can connect partial via 117a to pad 117c. Trace 117b can be positioned on top surface of dielectric layer 116. Other patterns, such as trace 117e, can also be formed between two adjacent partial vias 117a.

Partial vias 117a cover their pad base 115d (and only partially in this example), without reaching or covering over parts of dielectric peripheral portions 116b that are positioned adjacent each other over outer areas of their pad 115c. This allows via-to-via distance 117z to be minimized further than if pad bases 115d were instead covered by full vias similar to, for example, full via 113a (FIG. 2C, 3B). In some examples, a reduced via-to-via distance 117z allows the ends 117ax to be spaced closer together with a reduced pitch. In addition, because of the additional space made available in conductive layer 117 by using adjacent partial vias 117a instead of adjacent full vias, patterns such as trace 117e can be positioned between such partial vias 117a without violating layout design rules for minimum distances between adjacent traces or circuit patterns. In some examples, the use of adjacent partial vias 117a can permit via-to-via distance 117z to be reduced by, for example, at least approximately 25% compared to a corresponding case using adjacent full vias. For instance, a case using adjacent partial vias 117a would permit minimization of via-to-via distance 117z to at least approximately 30 μm, compared to a case using adjacent full vias that would require via-to-via distance 117z to be at least approximately 40 μm, although the scope of the present disclosure is not limited in this respect.

Pad 117c can be similar to, and can be similarly formed as, pad 115c. Pad 117c is formed on dielectric layer 116 and coupled to trace 117b. Redistribution layer 117 can reduce a distance between each of the patterns of redistribution layer 117 by forming partial via 117a partially covering base 115d and peripheral portion 116b, compared to a case of forming a full via entirely covering a base, thereby achieving miniaturization.

Figure 2H:
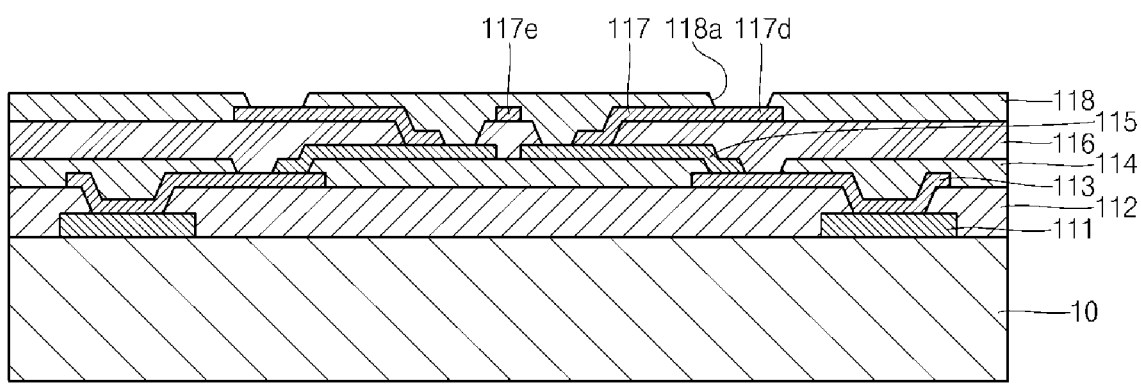

FIG. 2H shows semiconductor device 100 at a later stage of manufacture. In the example shown in FIG. 2H, dielectric layer 118 can be formed to entirely cover base 115d, redistribution layer 117 and dielectric layer 116, and an aperture 118a exposing a base 117d of redistribution layer 117 can be formed by patterning dielectric layer 118. Aperture 118a can expose base 117d that is a portion of a top surface of pad 117c to the outside.

Dielectric layer 118 can comprise or be referred to as, for example, a passivation layer, an insulating layer or a protection layer. In some examples, dielectric layer 118 can include an electrically insulating material, including, for example, a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layer 118 can be formed using any of a variety of processes (e.g., spin coating, spray coating, printing, PVD, CVD, MOCVD, ALD, LPCVD, or PECVD). Dielectric layer 118 can have a thickness in the range from approximately 3 μm to approximately 30 μm.

After a mask pattern is formed on a top surface of dielectric layer 118, aperture 118a can be formed by removing the dielectric layer 118 exposed by etching. Aperture 118a can comprise or be referred to as an opening or a hole. Dielectric layer 118 can expose base 117d that is a portion of a top surface of pad 117c through aperture 118a. Base 117d exposed by aperture 118a can be shaped, for example, as a circle, a rectangle, or a polygon. The shape of base 117d exposed by aperture 118a can be the same shape as pad 117c of redistribution layer 117. The area of base 117d exposed by aperture 118a can be smaller than the area of pad 117c of redistribution layer 117. In addition, base 117d exposed by aperture 118a can have a diameter in the range from approximately 10 μm to approximately 500 μm.

Figure 2I:
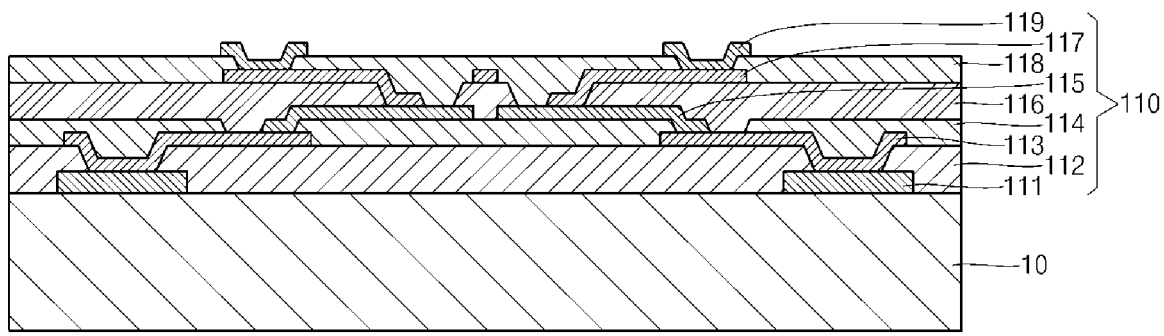

FIG. 2I shows semiconductor device 100 at a later stage of manufacture. In the example shown in FIG. 2I, conductive layer 119 can be formed to cover the base 117d of redistribution layer 117 and the exposed surface of dielectric layer 118.

Conductive layer 119 can be formed to have a plurality of patterns, which can be electrically connected to base 117d of redistribution layer 117 exposed through aperture 118a, respectively. In addition, conductive layer 119 electrically connected to redistribution layer 117 can be formed to partially cover a top surface of dielectric layer 118. Conductive layer 119 can be electrically connected to external pad 111 through redistribution layer 117 as well as redistribution layer 115 and redistribution layer 113.

Conductive layer 119 can comprise or be referred to as a conductive pad, an interconnect pad, a micro pad, a bond pad, a bump pad, or an under-bump metal metallization (UBM). In some examples, interconnect pads 119 can be made of any of a variety of electrically conductive materials (e.g., copper, gold, silver, or an equivalent). An anti-oxidant layer, which is made of tin, gold, silver, nickel, palladium, or an equivalent, for preventing interconnect pads 119 from being oxidized, can be further formed on interconnect pads 119. Interconnect pads 119 can be formed using any of a variety of processes including, but not limited to, sputtering, electroless plating, electroplating, PVD, CVD, MODVD, ALD, LPCVD, PECVD, or an equivalent.). After interconnect pads 119 are formed to a predetermined thickness to cover the base 117d of redistribution layer 117 and the exposed surface of dielectric layer 118, redistribution layer 117 can be patterned using a mask pattern to have a plurality of patterns. Interconnect pads 119 can have a thickness in the range from approximately 5 μm to approximately 300 μm.

As interconnect pads 119 are formed in the above-described manner, substrate 110 can be completed. Although the substrate 110 comprising five conductive layers 111, 113, 115, 117 and 119 and four dielectric layers 112, 114, 116 and 118 is illustrated, the number of layers of substrate 110 can be smaller or larger than five conductive layers 111, 113, 115, 117 and 119 and four dielectric layers 112, 114, 116 and 118, and the scope of the disclosed subject matter is not limited in these respects.

Figure 2J:
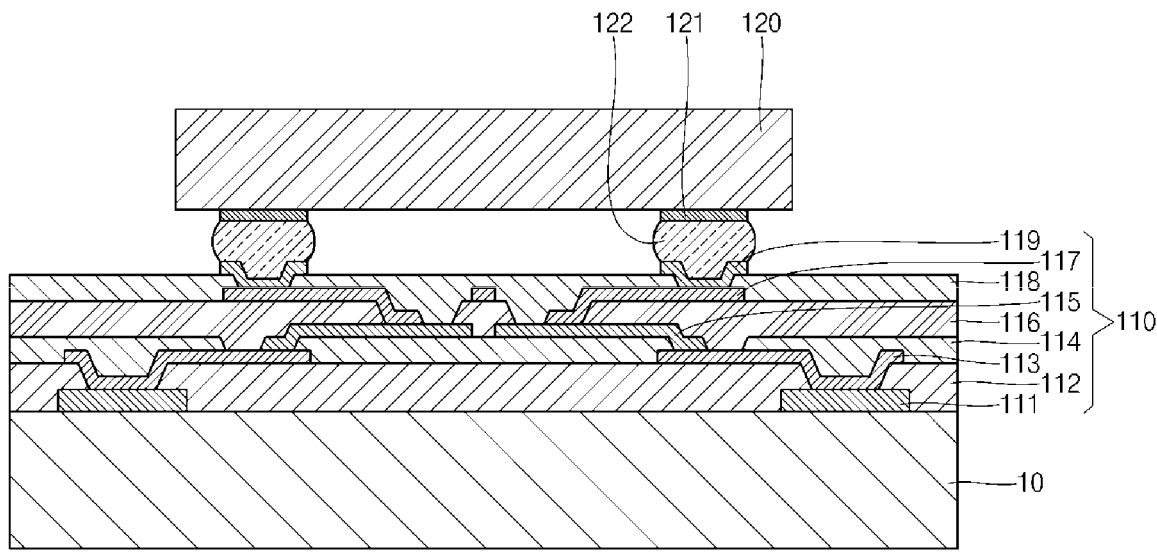

FIG. 2J shows semiconductor device 100 at a later stage of manufacture. In the example shown in FIG. 2J, device 120 can be electrically connected to conductive pads 119 of substrate 110. In some examples, substrate 110 can be a redistribution layer (RDL) substrate.

In some examples, a pick-and-place equipment can pick up electronic device 120 to place the same on interconnect pads 119 of substrate 110. Next, electronic device 120 can be electrically connected to substrate 110 by mass reflow, thermal compression, or laser assist bonding. Electronic device 120 can be provided having an interconnect 122 electrically coupled to the first conductor 117, or electrically coupled to conductor 115, conductor 113, or conductor 111.

In some examples, electronic device 120 can comprise or be referred to as a semiconductor die or a semiconductor chip. In addition, in some examples, electronic device 120 can comprise at least one of a logic die, a micro control unit, a memory, a digital signal processor, a network processor, a power management unit, an audio processor, an RF circuit, a wireless baseband system on chip processor, an application specific integrated circuit, or an equivalent.

In some examples, electronic device 120 can include an active region and a non-active region. In addition, in some examples, the active region can be disposed to face substrate 110. In addition, in some examples, the active region can include interconnects 121. In some examples, interconnects 121 can comprise or be referred to as die pads, bond pads, aluminum pads, bumps, conductive pillars or conductive posts.

In addition, interconnects 121 can be connected to interconnect pads 119 of substrate 110 using a low melting point material 122. In an example, the low melting point material 122 can comprise one or more of Sn, Ag, Pb, Cu, Sn—Pb, Sn37-Pb, Sn95-Pb, Sn—Pb—Ag, Sn—Cu, Sn—Ag, Sn—Au, Sn—Bi, Sn—Ag—Cu, or equivalents. Interconnects 121 of electronic device 120 and interconnect pads 119 of substrate 110 can be electrically connected to each other by the low melting point material 122. Interconnects 121 and low melting point material 122 can have a thickness in the range from approximately 5 µm to approximately 300 µm.

Figure 2K:
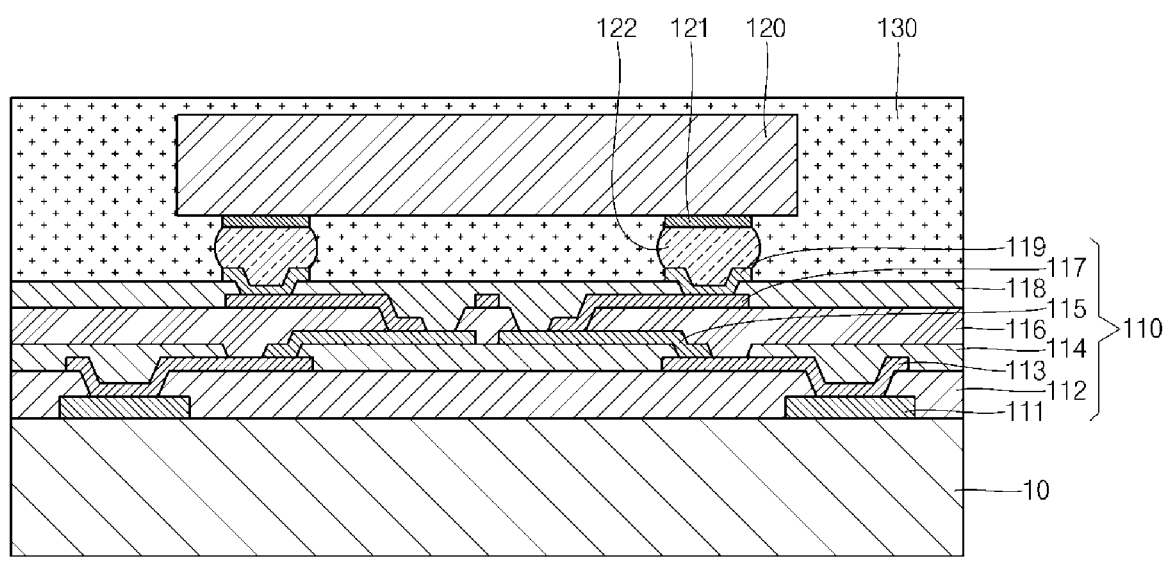

FIG. 2K shows semiconductor device 100 at a later stage of manufacture. In the example shown in FIG. 2K, encapsulant 130 can be formed to partially or entirely cover a top surface 110x of substrate 110 and a top surface or a side surface of electronic device 120. In some examples, encapsulant 130 can comprise or be referred to as an epoxy molding compound, an epoxy molding resin, or a sealant. In addition, in some examples, encapsulant 130 can comprise or be referred to as a molding part, a sealing part, an encapsulation part, a protection part, a package, or a body part. In some examples, encapsulant 130 can include, but is not limited to, an organic resin, an inorganic filler, a curing agent, a catalyst, a colorant, a flame retardant, and so on. Molding based on encapsulant 130 can be formed by any of a variety of processes. In some examples, encapsulant 130 can be formed by, but not limited to, compression molding, transfer molding, liquid-phase encapsulant molding, vacuum lamination, paste printing, or film assist molding. Encapsulant 130 can have a thickness in the range from approximately 50 µm to approximately 300 µm. Encapsulant 130 can encapsulate electronic device 120, thereby protecting electronic device 120 in a packaged state from external factors or circumstances. In some examples, encapsulant 130 can be provided on the top side of substrate 110 contacting a side of electronic device 120. Substrate 110 can be a redistribution layer (RDL) substrate in some examples.

Figure 2L:
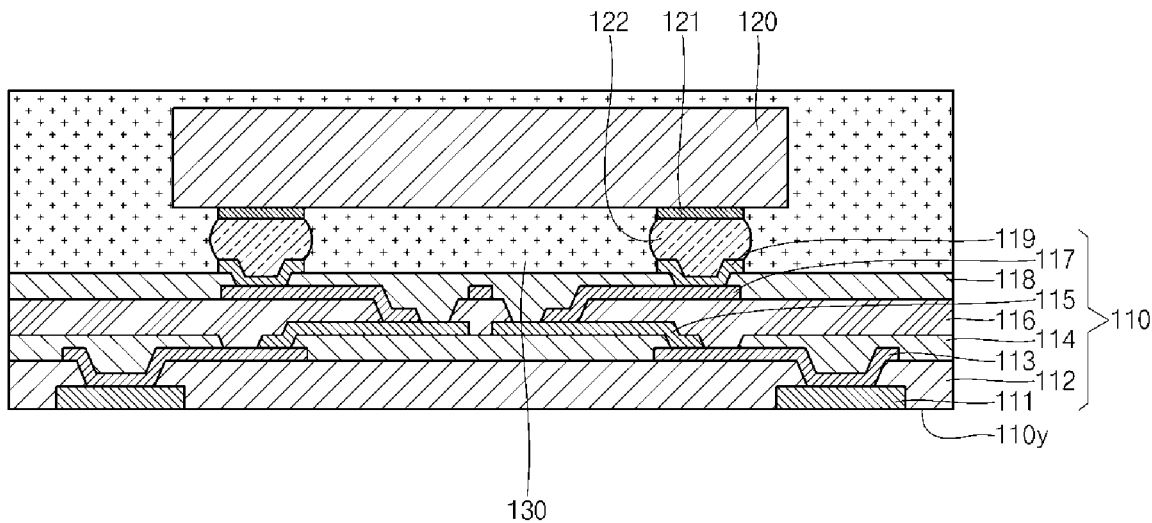

FIG. 2L shows semiconductor device 100 at a later stage of manufacture. In the example shown in FIG. 2L, a bottom surface 110y of substrate 110 can be exposed by removing carrier 10. If carrier 10 is removed, external pad 111 and dielectric layer 112 can be exposed through the bottom surface 110y of substrate 110. Carrier 10 can be removed by general grinding or chemical etching. Alternatively, carrier 10 can be removed by a release process using ultraviolet (UV) radiation or a laser.

Figure 2M:
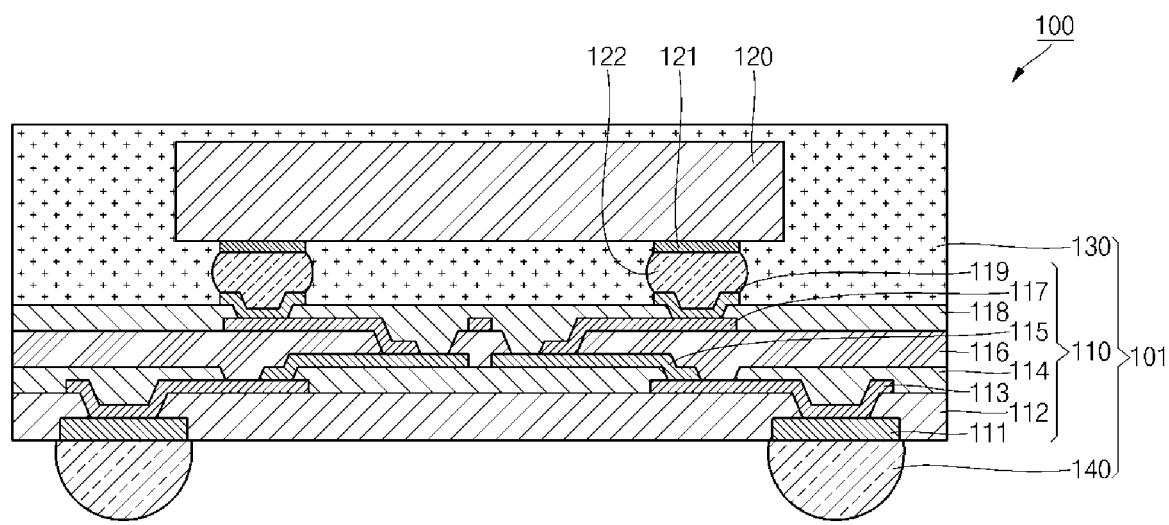

FIG. 2M shows semiconductor device 100 at a later stage of manufacture. In the example shown in FIG. 2M, interconnects 140 can be formed on external pad 111 exposed to a bottom surface 110y of substrate 110.

Interconnects 140 can be electrically connected to the bottom surface of external pad 111. Interconnects 140 can be electrically connected to electronic device 120 through conductive layers 111,113,115,117, and 119 of substrate 110. In some examples, interconnects 140 can include tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu, or equivalents.

Interconnects 140 can be formed by, for example, a ball drop process, a screen-printing process, or an electroplating process. In some examples, interconnects 140 are formed by forming an electrically conductive material including solder on the bottom surface of external pad 111 of substrate 110, conductive layer 122 using a ball drop process, followed by a reflow process. At this stage, the bottom surface 110y of substrate 110 can be disposed to face upward. Interconnects 140 can comprise or be referred to as conductive balls, such as solder balls, conductive pillars, such as copper pillars, or conductive posts having solder caps on copper pillars. Interconnects 140 can have a size in the range from approximately 20 µm to approximately 500 µm.

The present disclosure includes reference to certain examples as described herein. It will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples including examples falling within the scope of the appended claims.

The invention claimed is:

1. A semiconductor device, comprising:
    a substrate comprising a dielectric, a first conductor on a top side of the dielectric, and a second conductor on a bottom side of the dielectric, wherein the dielectric has an aperture, and the first conductor comprises a partial via contacting a pad of the second conductor through the aperture, wherein the partial via covers half or less of a base portion of the pad exposed by the aperture;
    an electronic device having an interconnect electrically coupled to the first conductor; and
    an encapsulant on a top side of the substrate contacting a side of the electronic device.

2. The semiconductor device of claim 1, wherein the substrate comprises a third conductor on the top side of the dielectric, and a fourth conductor on the bottom side of the dielectric, wherein the dielectric has an additional aperture, and the third conductor comprises a partial via contacting a pad of the fourth conductor through the additional aperture.

3. The semiconductor device of claim 2, further comprising a trace on the dielectric between the partial via of the first conductor and the partial via of the third conductor.

4. The semiconductor device of claim 2, wherein an end of the partial vial of the first conductor and an end of the partial via of the third conductor are spaced apart by 30 microns or less.

5. The semiconductor device of claim 2, wherein:
the first conductor comprises a first trace on the top side of the dielectric and continuous with the partial via; and
the first trace and the partial via comprise a same width.

6. The semiconductor device of claim 1, wherein:
an end of the partial via contacts the pad of the second conductor; and
a trace adjacent the end of the partial via overlaps a portion of the pad of the second conductor not covered by the partial via.

7. The semiconductor device of claim 6, wherein the trace overlaps a portion of a gap between the pad of the second conductor and an adjacent pad.

8. The semiconductor device of claim 1, wherein the partial via comprises a linear shape.

9. The semiconductor device of claim 1, wherein the partial via comprises a semicircular shape.

10. The semiconductor device of claim 1, wherein an end of the partial via is at a center of the pad of the second conductor.

11. The semiconductor device of claim 1, wherein the partial via covers half or less of a sidewall of the aperture.

12. A method to manufacture a semiconductor device, comprising:
providing a substrate comprising a dielectric, a first conductor on a top side of the dielectric, a second conductor on a bottom side of the dielectric, and an aperture in the dielectric, wherein the first conductor comprises a partial via contacting a pad of the second conductor through the aperture;
providing an electronic device having an interconnect electrically coupled with the first conductor; and
providing an encapsulant on a top side of the dielectric and contacting a side of the electronic device;
wherein at least one of:
a) the substrate comprises:
a third conductor on the top side of the dielectric;
a fourth conductor on the bottom side of the dielectric; and
an additional aperture in the dielectric;
wherein the third conductor comprises a partial via contacting a pad of the fourth conductor through the additional aperture; and
wherein the partial via of the first conductor and the partial via of the third conductor are spaced apart at a reduced distance in the dielectric compared to a distance between full vias through the same dielectric;
b) the pad of the second conductor for the partial via is reduced in size compared to the size of pads for full vias through the same dielectric;
c) the partial via of the first conductor covers half or less of a base portion of the pad of the second conductor exposed by the aperture;
d) the partial via of the first conductor covers half or less of a sidewall of the aperture; or
e) the substrate comprises:
an additional dielectric having an additional aperture, wherein the second conductor is on a top side of the additional dielectric and comprises a full via in the additional aperture.

13. The method of claim 12, further comprising:
providing the third conductor on the top side of the dielectric;
providing the fourth conductor on the bottom side of the dielectric; and
providing the additional aperture in the dielectric, wherein the third conductor comprises the partial via contacting the pad of the fourth conductor through the additional aperture;
wherein the partial via of the first conductor and the partial via of the third conductor are spaced apart at the reduced distance in the dielectric compared to the distance between full vias through the same dielectric.

14. The method of claim 12, wherein the pad of the second conductor for the partial via is reduced in sized compared to the size of the pads for full vias through the same dielectric.

15. The method of claim 12, wherein the partial via of the first conductor covers half or less of the base portion of the pad of the second conductor exposed by the aperture.

16. The method of claim 12, wherein the partial via of the first conductor covers half or less of the sidewall of the aperture.

17. The method of claim 12, wherein the second conductor is on the top side of the additional dielectric and comprises the full via in the additional aperture.

18. A semiconductor structure, comprising:
a redistribution layer (RDL) substrate, comprising:
a first dielectric layer having a first aperture;
a first conductive layer on the first dielectric layer, wherein the first conductive layer has a full via in the first aperture;
a second dielectric layer having a second aperture, wherein the second dielectric layer is on a top surface of the first dielectric layer; and
a second conductive layer on a top surface of the second dielectric layer, wherein the second conductive layer has a partial via in the second aperture contacting the first conductive layer through the second aperture;
an electronic device on a top side of the RDL substrate, wherein the electronic device comprises an interconnect electrically coupled with the second conductive layer; and
an encapsulant on the top side of the RDL substrate contacting a side of the electronic device.

19. The semiconductor structure of claim 18,
wherein the first dielectric layer has a third aperture and the first conductive layer has a full via in the third aperture,
wherein the second dielectric layer has a fourth aperture and the second conductive layer has a partial vial in the fourth aperture,
wherein the full vias of the first conductive layer contact lower pads exposed at a bottom surface of the first dielectric layer,
wherein the partial vias of the second conductive layer contact pads of the first conductive layer, and
wherein the pads of the first conductive layer are smaller in size than the lower pads.

20. The semiconductor device of claim 18, wherein:
an end of the partial via contacts a pad of the first conductive layer; and
a trace adjacent the end of the partial via overlaps a portion of the pad of the first conductive layer not covered by the partial via.

21. The semiconductor structure of claim 18, wherein the partial via covers half or less of the first conductive layer exposed at a bottom of the aperture.

22. A semiconductor device, comprising:
a substrate comprising a dielectric, a first conductor on a top side of the dielectric, and a second conductor on a bottom side of the dielectric, wherein the dielectric has an aperture, and the first conductor comprises a partial via contacting a pad of the second conductor through the aperture, wherein the partial via covers half or less of a sidewall of the aperture;

an electronic device having an interconnect electrically coupled to the first conductor; and an encapsulant on a top side of the substrate contacting a side of the electronic device.

\* \* \* \* \*